United States Patent [19]

Kamoshida

[11] Patent Number: 4,571,685
[45] Date of Patent: Feb. 18, 1986

[54] PRODUCTION SYSTEM FOR MANUFACTURING SEMICONDUCTOR DEVICES

[75] Inventor: Mototaka Kamoshida, Tokyo, Japan

[73] Assignee: NEC Corporation, Tokyo, Japan

[21] Appl. No.: 506,677

[22] Filed: Jun. 22, 1983

[30] Foreign Application Priority Data

Jun. 23, 1982 [JP] Japan ................................ 57-107802
Aug. 12, 1982 [JP] Japan ................................ 57-140253

[51] Int. Cl.$^4$ ...................... G06F 15/46; G05B 13/02; G06G 7/64; H01L 21/66
[52] U.S. Cl. .................................. 364/468; 364/164; 364/150; 29/574
[58] Field of Search ............... 364/150, 151, 164, 165, 364/468, 490, 491, 552; 29/569, 574; 156/627

[56] References Cited

U.S. PATENT DOCUMENTS

| | | | |
|---|---|---|---|
| 3,461,547 | 8/1969 | Curcio | 29/574 |
| 3,618,199 | 11/1971 | King et al. | 29/569 |
| 3,751,647 | 8/1973 | Maeder et al. | 29/574 X |
| 3,946,212 | 3/1976 | Nakao et al. | 364/164 X |
| 4,151,589 | 4/1979 | Ross | 364/164 X |
| 4,213,175 | 7/1980 | Kurihara | 364/150 X |

Primary Examiner—Jerry Smith
Assistant Examiner—Jon D. Grossman
Attorney, Agent, or Firm—Laff, Whitesel, Conte & Saret

[57] ABSTRACT

A production system for manufacturing semiconductor devices comprises apparatus for making a semiconductor wafer during a first process step. A plurality of semiconductor devices, or semiconductor chips are arranged and incorporated in the wafer. A second apparatus processes the semiconductor material in a second process step during production. An inspection apparatus provides an automatic inspection function between the first and the second process steps. The inspection result is automatically estimated by the inspection apparatus, with respect to a specification value and a central value within the specification value. The inspection apparatus is connected to a third apparatus for carrying out at least one further manufacturing step after the second process step. Accordingly, if the estimate of the inspection apparatus is within the specification value, but out of adjustment with respect to the central value. An instruction signal can be automatically sent to either the second or the third manufacturing apparatus, to compensate in the direction of the central value.

3 Claims, 9 Drawing Figures

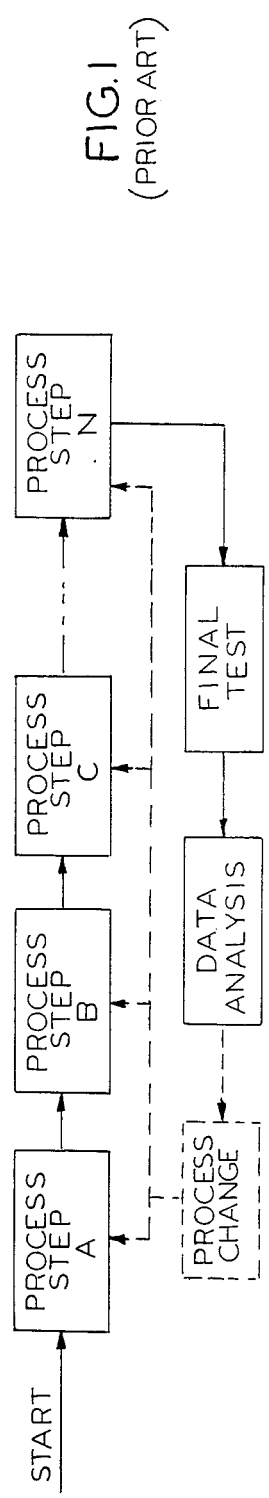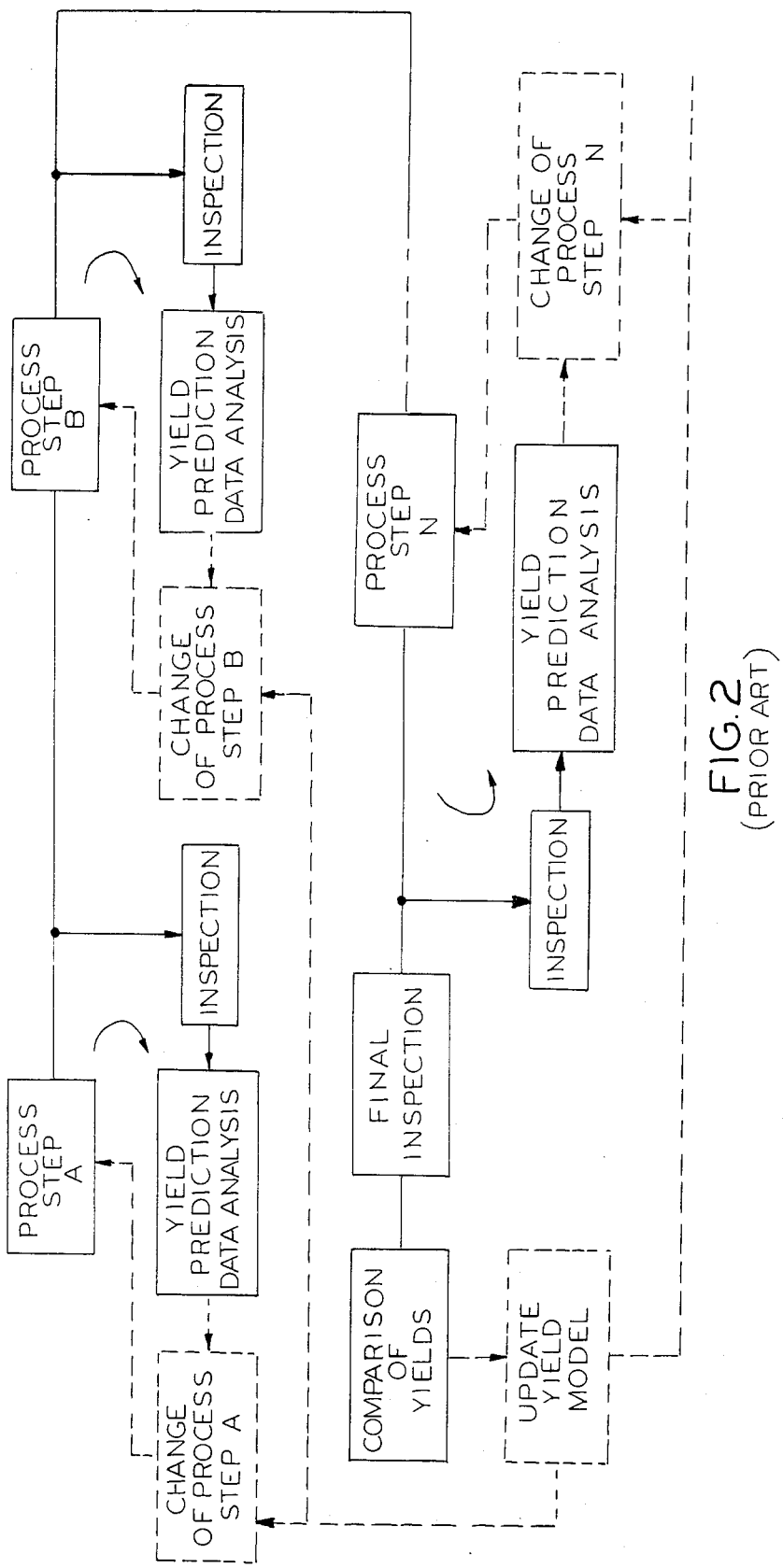

PRODUCTION SYSTEM FOR MANUFACTURING SEMICONDUCTOR DEVICES

BACKGROUND OF THE INVENTION

This invention relates to an automated production system for manufacturing semiconductor devices, and to a method of manufacturing semiconductor devices with at least a partially continuous production line.

Generally, a plurality of semiconductor devices, or chips, are formed in a semiconductor wafer through the use of a series of process steps such as epitaxial growth, oxidation, resist treatment including application of resist, exposure to light, development and etching, impurity doping by thermal diffusion or ion injection, gas-phase growth of polycrystalline silicon, silicon nitride film, and silicon oxide film, etc., forming of electrodes and lead wires, and so on.

Heretofore, a production system for manufacturing semiconductor devices has been automatized in each process step and in each connection between one process step and another process step. However, in the prior art, the automated production system has concentrated only on the yield for each process step. Therefore, a wafer which is not out of specification but is at a position off the central value of the specification in one process step is handed over to the next process step without any information concerning its being off the central value. The wafer that is within the specification but is off the central value in the previous process step is treated in the next process step under the same conditions as wafers that are not only within the specification but are also within the central value of the specification in the previous step. Therefore, the wafer that is off the central value may become defective in the next or subsequent process steps. Then the overall yield would be reduced. If someone intervenes in the next process step in order to correct the wafer that is off the central value, dirt will be introduced through such intervention and that will lower the reliability of the products made from the water. The overall yield will be unfavorably influenced by the dirt.

Namely, the method of manufacturing semiconductor devices and the production system thereof which is used in the prior art are, as described, for example, in U.S. Pat. No. 3,751,647. This system is based on the technology of obtaining data on completed products after a final test and altering each of the process steps by analysing the data, or on the technology of obtaining data on the completed products and data on products that are in an intermediate process step and changing the process step. Both technologies have a system of changing the conditions of a preceding process step after inspection, but the data of the inspection is not conveyed to the next process step. Accordingly, a product that is within the specification but off the central value in one process step will not be given any special treatment in the next process step to compensate for the deviation from the central value, and the deviation is carried on until the final process step, if the product is incapable of reaching it.

SUMMARY OF THE INVENTION

Therefore, an object of the present invention is to provide a production system for manufacturing semiconductor devices, which system has at least a partially continuous production line. Another object is to automatically convey the result of one process step to the next process step or to subsequent process steps. Here an object is to compensate for any deviation from the central value in the previous process step, thereby automating some of the interrelations between process steps without human intervention.

Another object of the invention is to provide a method of manufacturing a semiconductor device in which a result obtained in one process step is conveyed automatically to the next or subsequent process step. Compensation is automatically carried out in the next or subsequent process steps for the deviation from the central value resulting on the previous process step.

According to one feature of the present invention, a production system for manufacturing semiconductor devices comprises a first manufacturing apparatus used in a first process step for processing a material during production of a device such as a semiconductor wafer, in which a plurality of semiconductor devices, or semiconductor chips are to be arranged and incorporated. A second manufacturing apparatus is used in a second process step for processing the material during production, the second process step being provided after the first process step on a production line. An inspection apparatus has an automatic inspection function and is provided between the first process step and the second process step on the production line. A first means estimates automatically the inspection result by the inspection apparatus with a specification value and a central value within a specification value which was established for the inspection item beforehand. The first means is coupled with the inspection apparatus and the second manufacturing apparatus. The first means may also be connected to a third manufacturing apparatus which is used in a third process step after the second process step in the production line. Accordingly, when the result is inspected by the inspection apparatus and estimated by the first means to be within the specification value, but out of the central value, an instruction signal from the first means can be automatically sent to the second manufacturing apparatus or the second and third manufacturing apparatus to compensate for the deviation from the central value.

The production system of the present invention may comprise further a second menas for estimating automatically the inspection result by the inspection apparatus with respect to a specification value and a central value within the specification value established beforehand by the inspection item. The second means is connected with the inspection apparatus and the first manufacturing apparatus. Accordingly, the processing condition in the first manufacturing apparatus can be changed so that the condition will bring the end results within the central value in most subsequently produced products.

In the production system of the present invention, the first and second manufacturing apparatus, the inspection apparatus, and transfer means such as conveyor belt or robot for transferring the product between the first and second manufacturing apparatuses via the inspection apparatus are automatically and continuously conducted.

According to another aspect of the present invention, a method of manufacturing semiconductor device comprises the steps of automatically processing a semiconductor wafer in a first process step, and automatically transferring the wafer to an inspection apparatus. The inspection apparatus automatically inspects the result of the wafer obtained at the first process step, and automatically transfers the wafer to a second process step with a first instruction signal. The first instruction signal is automatically sent from the inspection apparatus to the second process step, through a first estimating means to compensate in the second process step for any deviation of the result obtained in the first process step, when the result is within a specification value, but is out of a central value, which is set up beforehand in the first estimating means.

When the result is within the central value, the wafer proceeds to the second process step without the first instruction signal. More concretely, when the wafer is inspected and found to be out of the specification value, it does not proceed to the second process step but is abandoned or is reworked in the first process step. When the result is within the central value in the specification value, the wafer proceeds to the second process step without the first instruction signal. Further, in the method, when the result is within the specification value, but is out the central value, a second instruction signal may be sent from the inspection apparatus to the first process step, through a second estimating means to change the processing conditions in the first process step so that the changed condition will bring the subsequent wafers within the central value.

According to a further aspect of the present invention, there is provided a processing system for a plurality of semiconductor wafers which flow automatically in a production line, one after another. The line comprises a first and second manufacturing apparatus for processing each of the wafers. An inspection apparatus has an automatic inspection function. A first transfer means automatically transfers the wafers from the first manufacturing apparatus to the inspection apparatus. A second transfer means automatically transfers the wafers from the inspection apparatus to the second manufacturing apparatus. A first means automatically estimates the inspected result produced by the inspection apparatus and transmits a first instruction to the second manufacturing apparatus to compensate for deviations in the result obtained in the first manufacturing apparatus.

The processing system may further comprise a second means for transmitting a second instruction to the first manufacturing apparatus to change the processing condition in the first manufacturing apparatus. The inspection by the inspection apparatus may be conducted collectively for a first group of the semiconductor wafers. In this case, the first instruction is transmitted to the second manufacturing apparatus against the first group collectively, and the second instruction is transmitted to the first manufacturing apparatus against a second collective group of the semiconductor wafers, following after the said first group. The inspection by the inspection apparatus is performed for each of the semiconductor wafers. The first instruction for the compensation for any deviation is passed on to the second manufacturing apparatus against the each of semiconductor wafers, respectively.

According to the present invention, it becomes possible to connect the manufacturing apparatus of the process step $P_N$ to the manufacturing apparatus of the next process step $P_{N+1}$ via the inspection apparatus $C_N$, without human intervention. Both process steps can be continued automatically, for enabling the continuous production of semiconductor devices. Furthermore, according to the invention, persons who are a source of contamination do not need to physically participate in the production line, with the result of keeping the production line very clean. Further, a uniform quality of products and a higher rate of operation of the production system and a higher productivity can be expected.

BRIEF DESCRIPTION OF THE DRAWING

FIG. 1 and FIG. 2 are block diagrams showing a manufacturing process of the prior art respectively;

DESCRIPTION OF THE PRIOR ART

In the prior art shown in FIG. 1, a semiconductor device is formed by process steps A to N. After process step N is completed, a final test is conducted. The data on it is analysed, and the actual yield is analysed. Then each process step is changed to increase the yield using the information on the finished products. In this case, changes in the process steps are carried out only after some time has elapsed after the process steps A and B in the initial stage were finished.

On the other hand, in the prior art shown in FIG. 2, information is obtained by the final inspection of the completed product after the process step N, and at the same time inspections are carried out after process step A or B. Process step A is changed by the inspection information obtained after process step A, and process step B is changed by the inspection information obtained after process step B. With these systems, however, the inspection information for previous process steps is not sent to subsequent process steps, to control them. Namely, the inspection information after process step A is not sent to control process step B. Accordingly, no compensation is applied to a product which is within specification after process step A, but which deviates from the central value, until after it reaches the last process step. It is, therefore, impossible to produce products with a high overall yield and uniform quality.

DESCRIPTION OF THE PREFERRED EMBODIMENT

Figure 3:
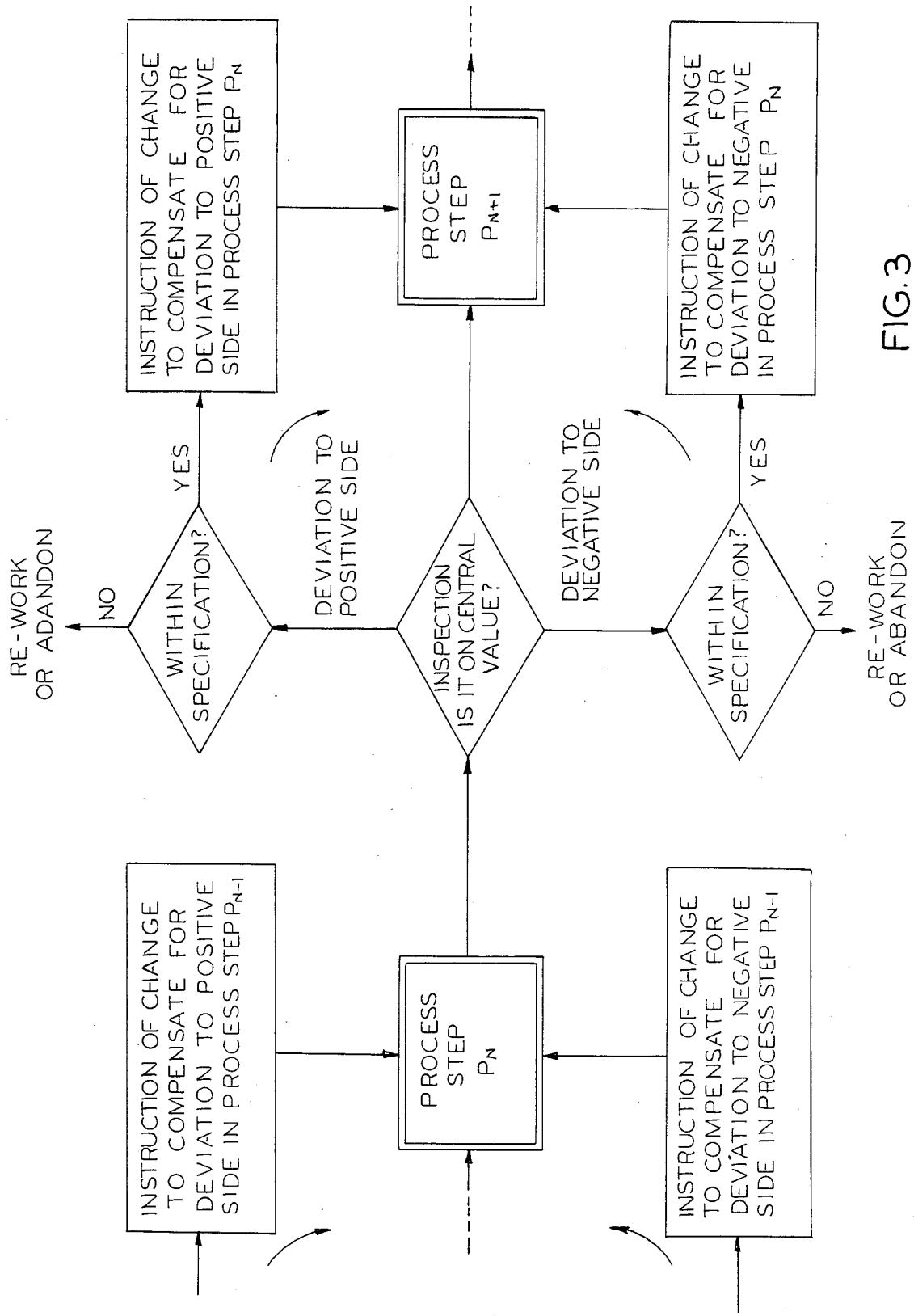
FIG. 3 and FIG. 4 are block diagrams showing a manufacturing process for each of a first and a second embodiment, respectively, of the present invention.

FIG. 3 explains the system of a first embodiment of the invention. The automatic production system has an inspection function introduced between process step $P_N$ and process step $P_{N+1}$ next succeeding the process step $P_N$. The physical conditions, such as the dimensions of the product during the production that has been obtained through process step $P_N$, are inspected by the inspection apparatus.

Any deviation to the positive or negative side from the central value is estimated. If there is a deviation to the positive side, for example, this is estimated to determine whether the value is within specification. If it is out of specification, the product produced during the production must be either reworked or abandoned. If it is within specification, the next proccess step $P_{N+1}$ is given information automatically to indicate how much the deviation was toward the positive side in the previous process step $P_N$. Based on this information, the conditions of the process step $P_{N+1}$ are changed in order to compensate for the deviation on the positive side.

On the other hand, if the deviation is to the negative side, the instruction is given to change the processing conditions in the process step $P_{N+1}$ so that they compensate in the process step $P_{N+1}$ for the deviation toward the negative side. That is, correction is toward the side opposite to the side toward which a positive deviation correction is made.

Figure 4:
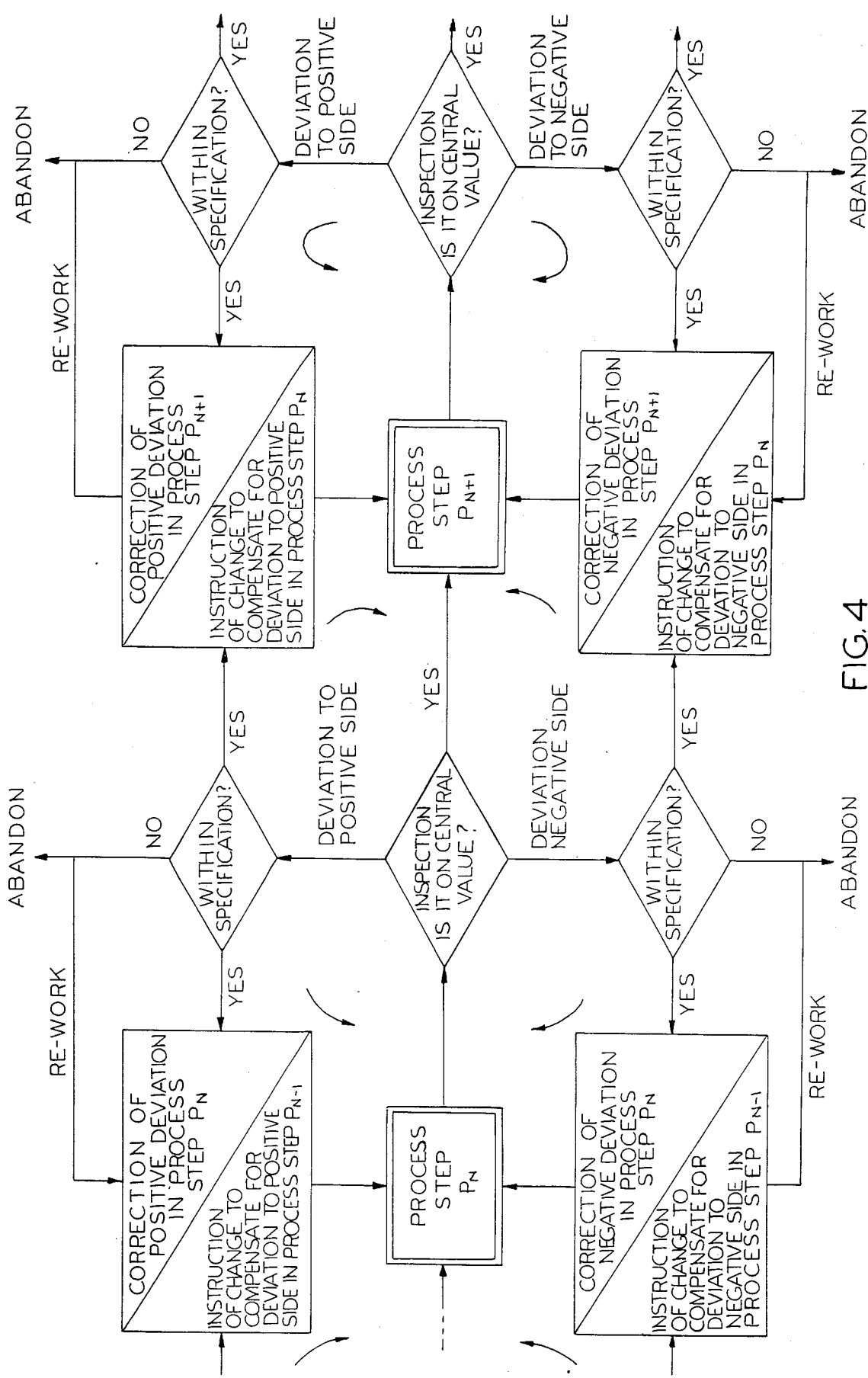

FIG. 4 shows the automatic production system of a second embodiment of the invention. The physical conditions, such as dimensions, obtained by process step $P_N$ are inspected and estimated between process steps $P_N$ and $P_{N+1}$. Also, the physical conditions obtained by process step $P_{N+1}$ are inspected and estimated between process step $P_{N+1}$ and $P_{N+2}$ (not shown). Each "Inspection" part in FIG. 4 actually comprises an inspection apparatus and a computer.

In the computer, the specification value and the central value within the specification value are memorized in advance. The product is judged as to which side the inspection value deviates from the desired central value. If the deviation is to the positive side, for instance, it is examined to determine whether the deviation is or is not within specification. If it is out of standard, the product must be reworked or discarded. If the deviation is within the specification, but out of the central value, the next process step $P_{N+1}$ or $P_{N+2}$ (not shown) is automatically given information on how much toward the positive side the product has deviated during production. Based on this information, the conditions of process step $P_{N+1}$ or $P_{N+2}$ are changed in order to compensate for the deviation in process step $P_N$ or $P_{N+1}$. Regardless of whether the deviation is within or outside of specification, another information that the deviation is toward the positive side is conveyed to the previous process step $P_N$ to change and correct the conditions of the process step $P_N$ themselves. The same applies when the deviation is to the negative side. In the system of the embodiment, an instruction is given in the next process step $P_{N+1}$ to compensate for the deviation and also to the previous process step $P_N$ to change the conditions of the process step.

It will be seen from the embodiments of the invention in FIG. 3 and FIG. 4 that the quality of the product is stabilized. The production line itself also becomes stable.

Figure 5:
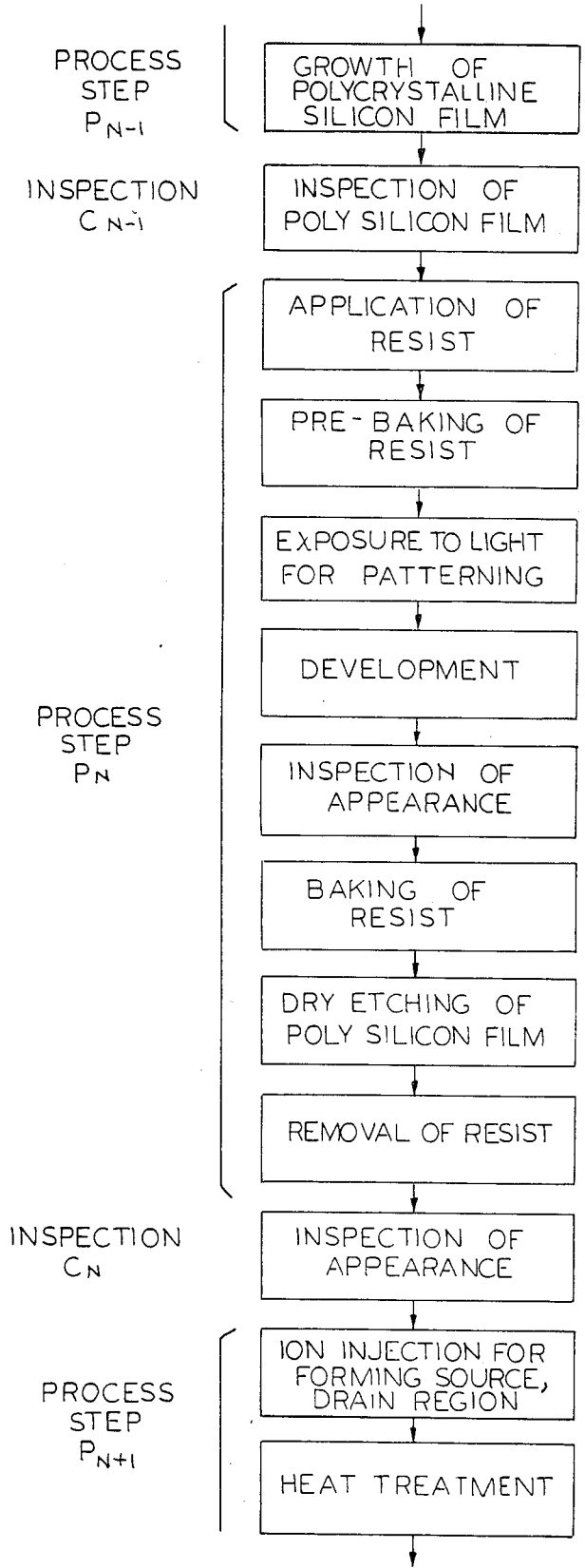
FIG. 5 is a process flow chart that explains, in further detail the embodiment of this invention.
Figure 6:
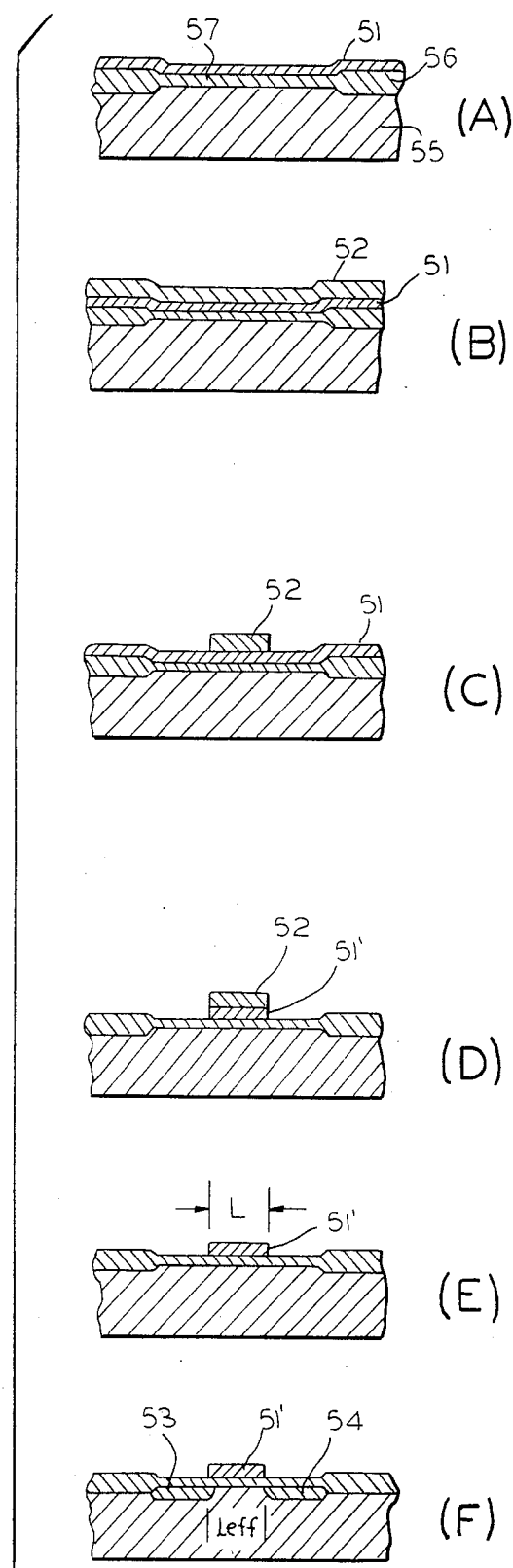
FIG. 6, which has sub-parts A through F, shows cross sections of a semiconductor wafer that corresponds to a product produced by the process flow chart of FIG. 5.

Here is another concrete example of the invention. FIG. 5 is a process diagram of part of the production process of an integrated circuit employing a MOS field-effect transistor. FIG. 5 shows the process step of etching the polycrystalline silicon that is to become the gate electrode and the next process step of forming the source and drain. FIG. 6 shows cross-sections of the wafer corresponding to the process diagram of FIG. 5.

In process step $P_{N-1}$, FIG. 6(A), a polycrystalline silicon film 51 is grown on a semiconductor wafer. A field insulating film 56 is provided over the field area of a semiconductor substrate 55. A gate insulating film 57 is provided over the active area thereof (FIG. 6(A)).

Film quality and film thickness inspection is conducted in inspection step $C_{N-1}$ (FIG. 5) on the polycrystalline silicon film.

Next, in process step $P_N$, the gate electrode of polycrystalline silicon film 51 is shaped on the gate insulating film. Namely, during this process step $P_N$, a photo resist film 52 is applied onto the polycrystalline silicon film 51 that was produced in process step $P_{N-1}$ (FIG. 6(B)). The resist film 52 is pre-baked at about 50° C. for 10 minutes. Then an exposure to light is made for patterning the photo resist film. After this, the resist film 52 is developed by a developer (FIG. 6(C)), and the appearance is inspected. If there are no abnormalities, the wafer and resist film is baked again at about 200° C. for one hour.

Next, a gas with a carbon tetrafluoride ($CF_4$) base is used for plasma etching the polycrystalline film 51 to form a gate electrode 51' (FIG. 6(D)). After this, the resist film 52 that was used as the mask during the etching is removed and the wafer is moved to inspection step $C_N$ (FIG. 6(E)).

Figure 7:
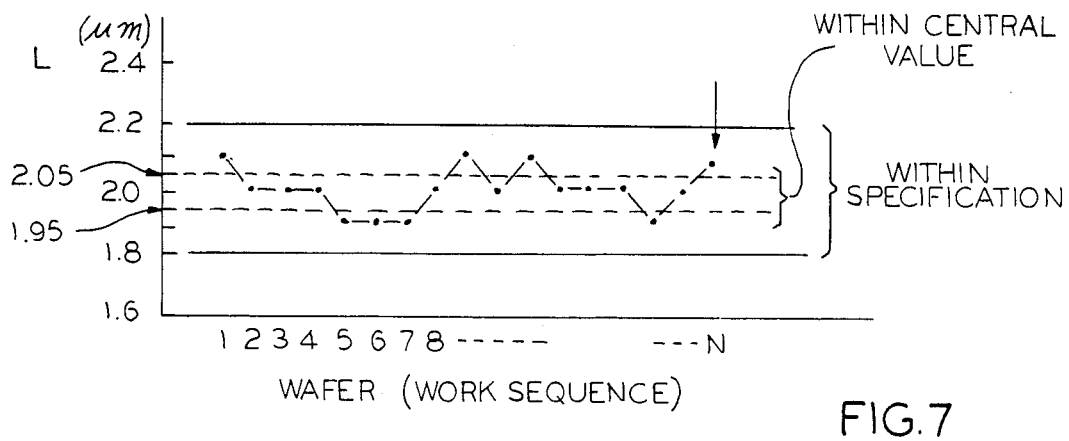
FIG. 7 is a quality control diagram for part of the process in order to explain in detail the embodiments of FIG. 5 and FIG. 6.

FIG. 7 shows an example of inspection data which was obtained for the width L of the gate electrode 51' of the polycrystalline silicon after etching. It is assumed that the gate electrode width is measured for N semiconductor wafers. The width measurement can be inspected by an automatic inspection apparatus by using a laser during inspection step $C_N$.

It is assumed that the specification value for the width of the gate electrode 51' is 2 $\mu$m±0.2 $\mu$m or (1.8 $\mu$m to 2.2 $\mu$m), and the central value is 2 $\mu$m±0.05 $\mu$m (or 1.95 $\mu$m to 2.05 $\mu$m). The width L of each of the gate electrodes of semiconductor wafers 2, 3, 4 and 8 (FIG. 7) is 2.0 $\mu$m, which is within the central value. However, the width L of each of the gate electrodes of four semiconductor wafers 1, ... N is 2.1 $\mu$m. This value is within the specification value, but is off the central value, with deviation to the positive side. In the same way, the width of each of four gate electrodes of semiconductor wafers 5, 6, 7 ... is 1.9 $\mu$m. This again is within the specification value, but is off the central value, with deviation to the negative side.

Since all these semiconductor wafers represented in FIG. 7 are within specification, they are sent on to the next process step $P_{N+1}$ where they go through an arsenic ion injection and heat treatment in the next process step to form the source 53 and drain 54 (FIG. 6(F)). At this point the above results have been transmitted to the next process step $P_{N+1}$. Accordingly, the heat treatment is at 1000° C., under nitrogen ($N_2$) flow after ion injection lasts for the 30 minutes, which is the standard time for semiconductor wafers 2, 3, 4, 8 ... However, for semiconductor wafers 1 ... N, in which the gate electrode width of which is off the central value in the positive direction, the heat treatment is applied for 35 minutes, so that an extra lateral heat diffusion is made and the effective channel length $L_{eff}$ becomes the same as that for semiconductor wafers 2, 3, 4, 8 ...

Figure 8:
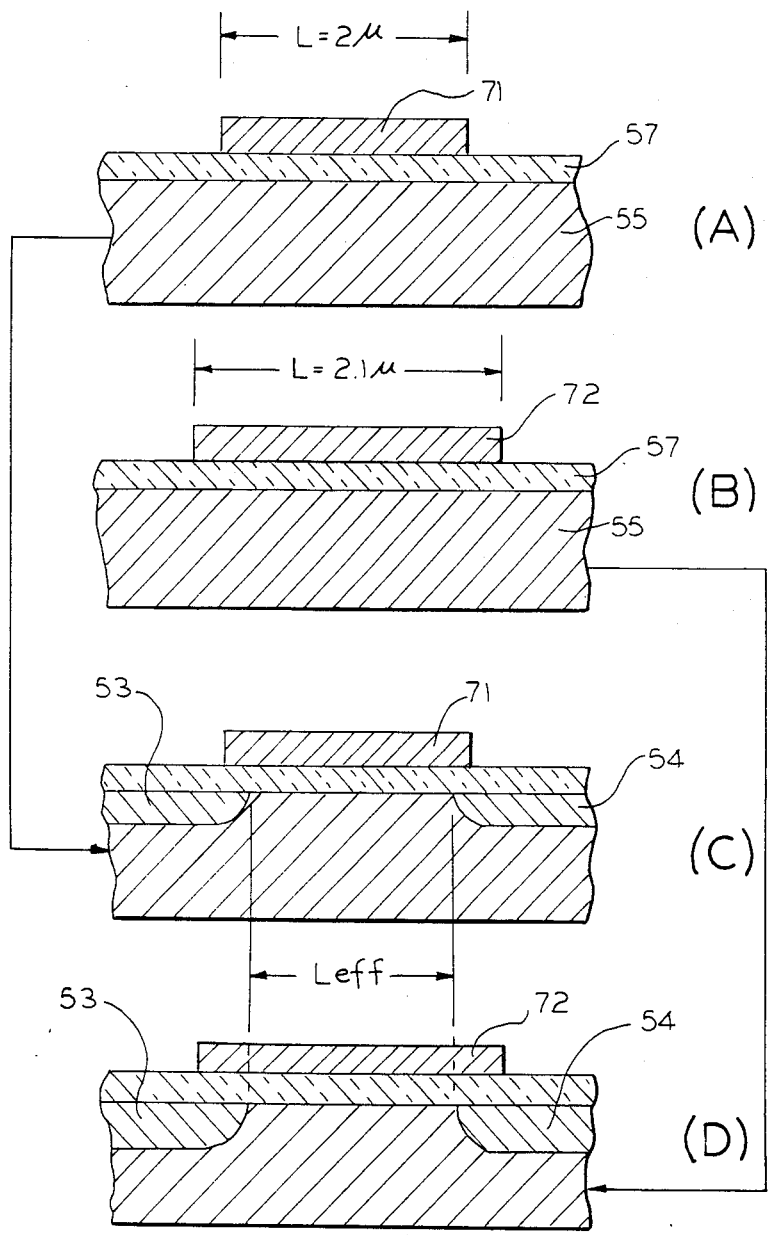
FIG. 8, which has sub-parts A through D, has cross-sections of the wafer.

FIG. 8 shows the process steps explained above. Namely, for the semiconductor wafers (FIG. 8(A)) in which the width L of the gate electrodes 71 is 2 $\mu$m, (i.e. within the central value), the time of the heat treatment is 30 minutes which is a standard time to obtain effective channel length $L_{eff}$ between the source 53 and the drain 54 as shown in FIG. 8(C). On the other hand, if the width L of the gate electrode 72 is 2.1 $\mu$m as in FIG. 8(B) (i.e. off center in the positive direction), it is within specification but not on the central value. Then, the time of the heat treatment is extended to thirty-five minutes in order to make the heat diffusion larger and to secure an effective channel length $L_{eff}$(FIG. 8(D)) that is the same as that of FIG. 8(C). In the same way, for semiconductor wafers 5, 6, 7 . . . in which the width of the gate electrodes is within specification, is not on the central value, but which deviate to the negative side, the standard heat treatment time is shortened to less than thirty minutes in order to make the lateral diffusion smaller and thereby secure the same effective channel length, $L_{eff}$.

The examples in FIGS. 5, 6, 7, and 8 correspond to the work sequence of FIG. 3. However, in the example, the information from inspection step $C_N$ may be transmitted at the same time to previous process step $P_N$, this corresponds to the embodiment of FIG. 4. Namely, when the number of semiconductor wafers that deviate to the positive side from the central value is larger than the number of semiconductor wafers that deviate to the negative side from the central value, the etching time in process step $P_N$ is made a little longer to control the amount of etching in the lateral direction and to bring the width L of gate electrode of most of the semiconductor wafers to the central value, 2.0 μm. Namely, information from inspection $C_N$ is thus given to the next process step $P_N$ to compensate for the deviation and is also used to change the conditions of process step $P_N$.

The above explanation concerns the relationship between the etching process and the impurity doping process. According to the invention all of the process steps can be interrelated in the same way. By using this interrelation, the production line is given a self-stabilizing capability. Wafers manufactured in this line have a uniform quality.

Further, the embodiments of the invention explained above have only illustrated the case of compensating for a deviation in process step $P_N$ in the next process step $P_{N+1}$, but the invention is not limited to this. Any deviation in process step $P_N$ can be compensated for in the next process step $P_{N+1}$ or in any other process step after $P_{N+1}$, if needed.

Further, the embodiments of the invention explained above omit a route requiring a change in the conditions of each process step according to the results of a final test, as shown in FIG. 1 and FIG. 2. It is needless to say that such a function can also be added to this system if necessary.

Figure 9:
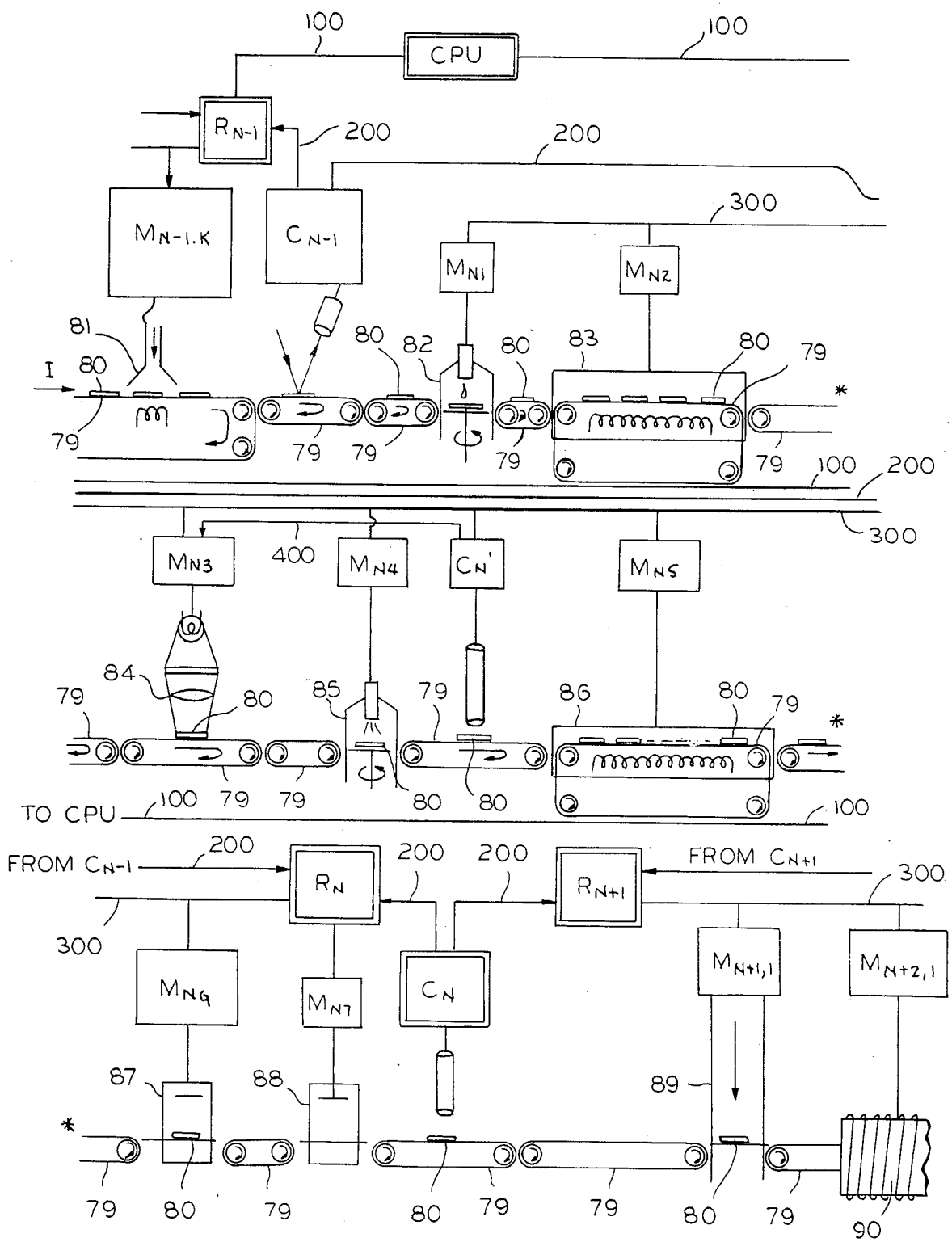
FIG. 9 is a system diagram that shows more schematically, a production line operating according to the flow chart of FIG. 5.

FIG. 9 schematically shows a production line incorporating the above embodiments of the invention. A plurality of semiconductor wafers 80 flow automatically one after another on automatic transfer means, such as conveyor belts 79, between manufacturing or inspection apparatus and under or in the apparatus. Control devices, that is computers, are provided to control the apparatus and the conveyor belts, and to cause them to work automatically.

FIG. 9 will be explained with reference to FIG. 5. In FIG. 9, a semiconductor wafer 80 is sent from a port I into a polycrystalline silicon growing apparatus 81. Computers $M_{N-1,K}$ control this polycrystalline silicon growing apparatus 81 for process step $P_{N-1}$. The computers $M_{N-1,K}$ are connected to a parent computer $R_{N-1}$. This parent computer is connected to a higher-echelon computer CPU by means of a line 100.

The wafer 80 is next sent to an automatic film-quality inspection apparatus $C_{N-1}$ where film thickness, film resistance, grain size, etc., are inspected, and their values are sent to parent computers $R_{N-1}$ and $R_N$ via a line 200. The specification values and the central values of the film thickness and film resistance are memorized in the parent computers $R_{N-1}$ and $R_N$ beforehand. The inspected values (such as film thickness and film resistance) are evaluated to determine whether they are within specification ranges, or within specification ranges but out of central ranges, or within central ranges, and whether their deviation is on a positive side or on a negative side, as measured from the central ranges and the specification ranges. Instructions are sent to each relevant manufacturing apparatus through each computer ($M_{N-1,K}$, $M_{N1}$, $M_{N2}$ ... $M_{N7}$), that is through a control device for each manufacturing apparatus.

If the values are within specification, the wafer 80 is sent to a resist application apparatus 82 where a resist solution is applied by centrifuge. The apparatus 82 is connected to the parent computer $R_N$ through control device $M_{N1}$ by way of line 300.

If the values are outside of the specification, the wafer is rejected from the production line responsive to the instruction from the parent computer $R_N$. The rejection is not shown in FIG. 9.

After this, the wafer is placed in a drying oven 83 for pre-baking. The oven 83 is controlled by control device $M_{N2}$ connected to the parent computer $R_N$ via line 300. Then the wafer is exposed to ultra-violet light for patterning in an exposure apparatus 84 connected to the parent computer $R_N$ through a control device $M_{N3}$ and line 300. Then the wafer 80 is developed by a developer 85 and its appearance is inspected by an appearance inspection apparatus $C_N'$. The apparatus $C_N'$ can automatically inspect the appearance of the resist pattern by using reflect-light. The result is feed-backed to a control device $M_{N3}$ of the exposure apparatus 84 via a line 400.

Next, the resist is hardened in an atmosphere at 200° C. by means of a baking furnace 86 connected to its control device $M_{N5}$. After the wafer 80 is sent to a dry etcher 87 to dry-etch the polycrystalline silicon, it is sent to a plasma asher 88 to remove the resist film. It is then inspected by an inspection apparatus $C_N$.

During these process steps all of the devices from the resist applicator 82 to the plasma asher 88 are controlled by computers $M_{N1}$ to $M_{N7}$, which are connected to the parent computer $R_N$ by way of a line 300. This parent computer $R_N$ is connected, if needed, to a higher-echelon computer CPU by way of the line 100. The inspection apparatus $C_N$ automatically checks the dimensions, shape, etc., of the etching pattern on the polycrystalline silicon. Generally, the inspection apparatus $C_N$ uses an interference of laser light for making the automatic inspection. Information on the inspected values are sent to parent computers $R_N$ and $R_{N+1}$ by way of line 200, respectively. The specification range and the central range within the specification range of, for example, the width of gate electrode are memorized beforehand, respectively. The parent computer $R_{N+1}$ evaluates if the inspected values are within the specification range, or within the specification range but out of the central range, or within the central range, and if their deviation is toward the positive or the negative side of the central range and the specifiation range.

An instruction is sent to each relevant manufacturing apparatus 89, 90, through each control device $M_{N+1,}$; and $M_{N+2,1}$. In the above-mentioned embodiment, the instruction for compensation is only sent to manufacturing apparatus of heat treatment device 90, through control device $M_{N+2,1}$. When an appropriate instruction is given, as explained above, the wafer is sent on to the next process step $P_{N+1}$. If the values are out of the specification range, the wafer is rejected from the production line responsive to the instruction from the parent computer $R_{N+1}$. The apearance of the rejection is not shown in FIG. 9. The parent computer $R_N$ evaluates the information received from the inspection apparatus $C_N$, and sends instructions to relevant manufacturing apparatus, through each control device.

The wafer that is within specification is sent to the next process step $P_{N+1}$. At first it is sent on to an ion injection apparatus 89 to which a computer $M_{N+1,1}$ is connected. The wafer is injected with the required quantity of ions according to the instruction of computer $R_{N+1}$, under regulated conditions. The semiconductor wafer 80 is then heat-treated by a heat-treatment apparatus 90 to obtain the above mentioned channel length $L_{eff}$. In this case, the inspection information from the inspection apparatus $C_N$ is sent to a computer $M_{N+1,2}$ connected to the heat treatment device 90, through the parent computer $R_{N+1}$ of process step $P_{N+1}$. In this way, the time of the heat treatment is individually controlled for each of the wafers. The inspection information from the inspection apparatus $C_N$ may be sent over the line 100 to the subsequent process steps $P_{N+2}$, $P_{N+3}$, ... (not shown) to control the parent computers $R_{N+2}$, $R_{N+3}$, ... (not shown).

All of the process steps can be automatically interrelated by use of the concept disclosed by this embodiment. Therefore, the production line can have a self-stabilizing capability, and the quality of the finished wafers can be uniform. In the embodiment of the invention, the deviations produced in a process step $P_N$ was compensated in only the process step $P_{N+1}$ next to it, but the invention is not limited to this. According to the invention, a deviation in a process step $P_N$ can be compensated for, not only in the next process step $P_{N+1}$, but also in any subsequent process step, if needed. The route required for changing the processing conditions for each process step according to the results of the final test in FIG. 1 and FIG. 2 is omitted, but it goes without saying that it can be added, if needed, to the functions obtainable by the invention.

Those who are skilled in the art will readily perceive how to modify the invention. Therefore, the appended claims are to be construed to cover all equivalent structures which fall within the true scope and spirit of the invention.

What is claimed is:

1. A method of manufacturing semiconductor devices in a production line having a first manufacturing apparatus; a second manufacturing apparatus; an inspection apparatus located between said first and second manufacturing apparatus; a first transfer means located between said first masnufacturing apparatus and said inspection apparatus; a second transfer means located between said inspection apparatus and said second manufacturing apparatus; a control unit coupled to said inspection apparatus and said second manufacturing apparatus, said control units storing therein a specification range and a central range within said specification range; said method comprising the steps of automatically carrying out a first process step on a semiconductor wafer in said first manufacturing apparatus to form a feature in said semiconductor wafer;

automatically transferring said semiconductor wafer from said first manufacturing apparatus to said inspection apparatus by use of said first transfer means;

automatically inspecting said feature in said semiconductor which is formed by said first manufacturing apparatus;

sending a first information signal indicating an inspected value of said feature to said control unit;

estimating said inspected value in said control unit to determine whether said inspected value is outside said specification range, within said specification range but outside said central value, or within both said specification and central values;

sending a second information signal from said control unit to said second manufacturing apparatus when said inspected value is within said specification range, but outside said central range;

automatically transferring said semiconductor wafer from said inspection apparatus to said second manufacturing apparatus by use of said second transfer means when said inspected value is within both said specification and central ranges or within said specification range, but outside said central range; and automatically carrying out a second process step on said semiconductor wafer in said second manufacturing apparatus under a first condition when said inspected value of said semiconductor wafer is within both specification and central ranges and under a second condition when said inspected value of said semiconductor wafer is within said specification range, but outside said central range; said second condition being changed from said first condition by said second information to compensate a deviation from said central range.

2. The method of claim 1 further comprising a step of sending a third information signal of estimated results of said inspected value from said control unit to said first manufacturing apparatus.

3. The method of claim 1 in which said first process step is forming a gate electrode and said second process step is forming source and drain regions.

* * * * *